United States Patent
Blanchard

(10) Patent No.: US 6,724,039 B1
(45) Date of Patent: *Apr. 20, 2004

(54) SEMICONDUCTOR DEVICE HAVING A SCHOTTKY DIODE

(75) Inventor: Richard Austin Blanchard, Los Altos, CA (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,535

(22) Filed: Aug. 31, 1998

(51) Int. Cl.$^7$ ............................................... H01L 29/76
(52) U.S. Cl. ..................... 257/328; 257/329; 257/449
(58) Field of Search ............................... 257/328, 329, 257/332, 449, 471; 438/268–274

(56) References Cited

U.S. PATENT DOCUMENTS

| | | | | |
|---|---|---|---|---|
| 4,419,811 A | * | 12/1983 | Rice ............................ | 438/274 |
| 4,598,461 A | * | 7/1986 | Love ............................ | 438/274 |
| 4,823,172 A | * | 4/1989 | Mihara ......................... | 257/144 |
| 4,904,613 A | * | 2/1990 | Coe et al. .................... | 438/274 |
| 5,049,953 A | * | 9/1991 | Mihara et al. ............... | 257/328 |
| 5,598,016 A | * | 1/1997 | Tanabe et al. ............... | 257/228 |
| 5,796,126 A | * | 8/1998 | Han et al. .................... | 257/141 |
| 5,818,084 A | * | 10/1998 | Williams et al. ............ | 257/146 |

FOREIGN PATENT DOCUMENTS

JP 09102602 A 4/1997

OTHER PUBLICATIONS

"Building a Better MOSFET: Generation 5 Hexfet," International Rectifier.

* cited by examiner

*Primary Examiner*—Ori Nadav
(74) *Attorney, Agent, or Firm*—David V. Carlson; Lisa K. Jorgenson

(57) ABSTRACT

A semiconductor device includes a semiconductor substrate having a first conductivity and a semiconductor layer disposed on the substrate and also having the first conductivity. A recess is disposed in the layer and has a sidewall and a bottom. A gate insulator is disposed on the layer and extends to the sidewall of the recess, and a gate is disposed on the gate insulator. A body region is disposed in the semiconductor layer beneath the gate, has a second conductivity, and is contiguous with the sidewall of the recess. A source region is disposed in the body region, has the first conductivity, and is contiguous with the sidewall. A Schottky contact is disposed on the bottom of the recess, and a source metallization is disposed on the Schottky contact and on the sidewall of the recess.

29 Claims, 5 Drawing Sheets

SEMICONDUCTOR DEVICE HAVING A SCHOTTKY DIODE

CROSS-REFERENCE TO RELATED APPLICATION

This application is a continuing prosecution application of pending U.S. patent application Ser. No. 09/144,535, filed Aug. 31, 1998.

TECHNICAL FIELD

The present invention relates generally to both discrete devices and integrated circuits, and more particularly to a merged semiconductor device having a Schottky diode and a method for forming the device. The semiconductor device uses the layout area more efficiently, and thus may be smaller, than prior-art merged semiconductor devices that include Schottky diodes.

BACKGROUND OF THE INVENTION

MOS-gated semiconductor devices, such as transistors, IGBTs, and MCTs, are used in many of today's electronic applications. For example, FIGS. 1A and 1B are respectively a cross-sectional and a schematic symbol of a vertical DMOS transistor 10. The transistor 10 includes a drain contact 12, which is disposed on a side of an N+ semiconductor substrate 14. An N− epitaxial layer 16 is disposed on the other side of the substrate 14 such that the layer 16 acts as the drain and the substrate 14 acts as the drain contact region of the transistor 10. P-body regions 18 are disposed in the layer 16, and N+ source regions 20 are disposed in the body regions 18. A gate 21 is disposed over the body regions 18 and is isolated therefrom by a gate insulator 22. Source/body contacts 23 are disposed on the layer 16 in contact with both the body regions 18 and the source regions 20. These contacts allow the body and source regions 18 and 20 to be biased to the same voltage as is desired in many applications. As a consequence, however, the body regions 18 form the anode and the layer 16 forms the cathode of a PN diode 24. Fortunately, as discussed below, this "built-in" diode serves to protect the transistor 10 from damage if the source voltage exceeds the drain voltage. Furthermore, the gate 21, contacts 23, and the underlying body and source regions 18 and 20 may be cellular structures such as squares, hexagons, or octagons, may be a meshed structure, may be interdigitated or striped, or may be other well-known geometries.

During a typical period of operation, the voltage on drain contact 12 is more positive than the source voltage on the source/body contacts 23, and the gate voltage on the gate 21 is greater than or equal to one threshold voltage above the source voltage. These conditions cause a channel region to form at the tops of the body regions 18 between the respective source regions 20 and the drain layer 16 so that a drain-to-source current flows from the drain contact 12, through the substrate 14, the layer 16, the channel regions, and the source regions 20, to contacts 23.

Conversely, during a transient period, the source voltage of the transistor 10 may become greater than the drain voltage. With the diode 24, however, if the source voltage would otherwise exceed the drain voltage by more than the forward voltage of the diode 24 (typically 0.7 V for a silicon diode), then the diode 24 conducts a current from the source contacts 23, through the body regions 18, layer 16, and substrate 14, to the drain contact 12. Thus, the diode 24 limits the source-to-drain voltage to approximately one diode drop.

Unfortunately, the conduction of a current by the diode 24 during such a transient period may adversely affect the subsequent operation of the transistor 10. More specifically, when the diode 24 conducts a current to limit the source-to-drain voltage of the transistor 10, minority carriers, here "holes", are injected from the P body regions 18 into the N− drain layer 16. In some instances, the minority carriers in the drain layer 16 will continue to support a flow of current through the diode 24 even after the source voltage becomes less than the drain voltage. In some applications, this continuing current flow may hinder or prevent the desired operation of the transistor 10.

To prevent the diode 24 from conducting current when the source voltage exceeds the drain voltage, a Schottky diode having a lower forward voltage can be added in parallel to the diode 24. As discussed below, because of its lower forward voltage, the Schottky diode will both protect the transistor 10 and prevent the diode 24 from conducting a current. A Schottky diode also does not introduce minority carriers into the drain region 16, preventing the problems that occur when minority carriers are introduced by a PN junction.

FIGS. 2A–2B are respectively a cross-section and a schematic symbol of a vertical DMOS transistor 30, which is similar to the transistor 10 of FIGS. 1A–1B except that it includes a built-in Schottky diode 32. The Schottky diode 32 is shown in the exploded section of FIG. 2A and in FIG. 2B. For clarity, like reference numerals are used FIGS. 2A–2B for elements common to FIGS. 1A–1B.

Referring to FIG. 2A, the transistor 30 has outer source/body regions 34, which include N+ source regions 36 and P body regions 38, and also has inner source/body regions 40, which include N+ source regions 42 and a P body regions 43. A gate 44 is disposed over the P body regions 38 and 43 and is insulated therefrom by a gate insulator 45. Outer source/body contacts 46 contact the source regions 36 and the body regions 38, and a source/body/Schottky contact 48 contacts the source regions 42 and the body regions 43 as well as the drain layer 16. During operation, the contacts 46 and 48 are electrically coupled together. The contact 48 includes a Schottky contact 50, which contacts the drain layer 16. Thus, the contact 50 forms the anode and the drain layer 16 forms the cathode of the Schottky diode 32. The contact 50 also contacts the source and body regions 42 and 43, and thus acts as an ohmic contact thereto. The contact 48 also includes a layer 51 of metal disposed on the Schottky contact 50. A built-in PN junction diode 52, which is similar to the diode 24 of FIGS. 1A–1B, is formed by parallel diodes 53 and 54. The P body regions 38 and 43 form the anodes of the diodes 53 and 54, respectively, and the N− drain layer 16 forms a common cathode for the diodes 53 and 54. As discussed below, so that the diode 52 does not turn on during a transient period, the Schottky diode 32 is constructed to have a lower forward voltage than the PN junction diode 52. For example, using conventional techniques, the Schottky diode 32 can be constructed to have a forward voltage of 0.3–0.5V, which is less than the 0.7V forward voltage of the diode 52. The device shown in cross-section in FIG. 2A may have any of the surface geometries that the device of FIG. 1A has.

During a typical period of operation, the transistor 30 operates in a manner similar to that described above for the transistor 10.

During a transient period, if the source voltage would otherwise exceed the drain voltage by more than the forward voltage of the Schottky diode 32, then the diode 32 conducts a current from the metal 51, through the Schottky contact 50, layer 16, and substrate 14, to the drain contact 12. Thus, the diode 32 protects the transistor 30 by limiting the source-to-drain voltage to the diode 32 forward voltage. Furthermore, because the forward voltage of the Schottky diode 32 is less than that of the diode 52, the diode 52 does not turn on, and thus does not cause minority carriers to be injected into the layers 14 and 16.

Unfortunately, the Schottky diode 32 occupies a relatively large layout area, and thus significantly increases the layout area of the transistor 30 as compared to the transistor 10 of FIGS. 1A–1B. Furthermore, the reverse breakdown voltage of the Schottky diode 32—the maximum value by which the voltage on the drain layer 16 can exceed the voltage on the contact 50 without causing the diode 32 to break down—is often relatively low. Thus, Schottky diode 32 may lower the maximum drain-to-source voltage of the transistor 30 below that of the transistor 10. Additionally, the processes available to manufacture the transistor 30 are often relatively complex and require relatively large numbers of mask and other processing steps.

SUMMARY OF THE INVENTION

In one aspect of the invention, a semiconductor device includes a semiconductor substrate having a first conductivity and a semiconductor layer disposed on the substrate and also having the first conductivity. A recess is disposed in the layer and has a sidewall and a bottom. A gate insulator is disposed on the layer and extends to the sidewall of the recess, and a gate is disposed on the gate insulator. A body region is disposed in the semiconductor layer beneath the gate, and has a second conductivity and is contiguous with the sidewall of the recess. A source region is disposed in the body region, has the first conductivity, and is contiguous with the sidewall. A Schottky contact is disposed on the bottom of the recess, and a source metallization is disposed on the Schottky contact and on the sidewall of the recess.

Such a semiconductor device requires no additional area for the built-in Schottky diode. Furthermore, in another aspect of the invention, the built-in Schottky diode has an increased reverse-breakdown voltage. Additionally, such a device can be manufactured using a simplified manufacturing process.

DETAILED DESCRIPTION OF THE INVENTION

Figure 3A:
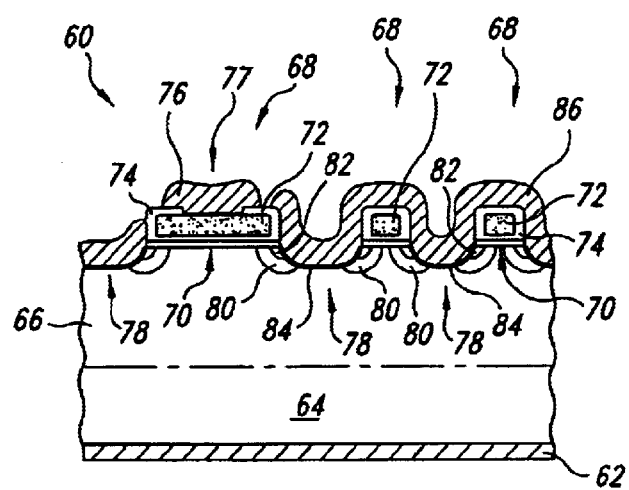
FIG. 3A is a cross section of an embodiment of a vertical DMOS transistor having a built-in Schottky diode according to the invention.
Figure 3B:
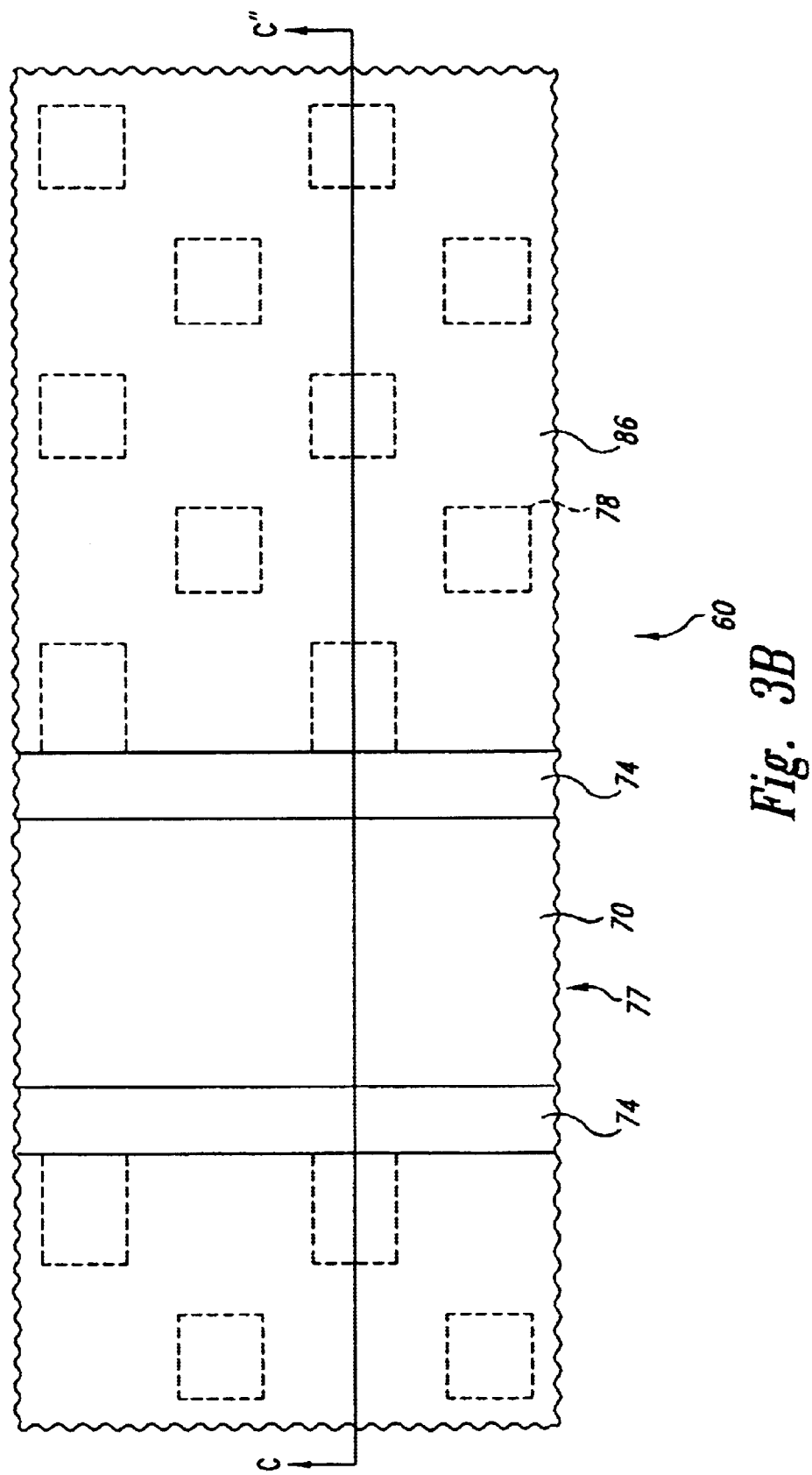
FIG. 3B is a top view of the transistor of FIG. 3A.

FIG. 3A is a cross section taken along line CC" of FIG. 3B of a vertical DMOS transistor 60 having a built-in Schottky diode according to an embodiment of the invention, and FIG. 3B is a top view of the transistor 60. Referring to FIG. 3A, the transistor 60 includes a drain contact 62, which is disposed on one side of an substrate 64, and a semiconductor layer 66, which is disposed on the other side of the substrate 64. In one embodiment, the drain contact 62 is formed from a metal sandwich such as chrome-silver, and the substrate 64 is doped N+ and the layer 66 is an N– doped epitaxial layer. A gate structure 68 is disposed on the layer 66. The gate structure includes a gate insulator 70 disposed on the layer 66, a gate 72 disposed on the gate insulator 70, side-wall insulators 74 disposed on the sides and top of the gate 72, and a gate contact 76, which contacts the gate 72 over a region 77 of the gate structure 68. In one embodiment, the region 77 is wider than the other regions of the gate structure 68 to facilitate the formation of the contact 76 and to facilitate the formation of a desired edge-of-die structure (not shown) according to conventional techniques. Additionally, in one embodiment, the gate insulator 70 and side-wall insulators 74 are formed from an oxide, the gate 72 is formed from polysilicon, and the contact 76 is formed from a metal such as aluminum.

Still referring to FIGS. 3A and 3B, one or more recessed regions 78 are disposed in the layer 66 and have respective bottoms and sidewalls. As discussed below, the regions 78 allow the transistor 60 to include a built-in Schottky diode with little or no increase in layout area. In one embodiment of the invention, the recessed regions have a substantially square cross-section and are arranged in an offset pattern as shown in FIG. 3B. In other embodiments, however, the regions 78 may have cross-sections of different shapes and may be arranged in a different patterns. For example, the regions 78 may be annular or may be arranged according to a conventional cellular pattern. Interdigitized, stripe, and mesh patterns are also possible. Additionally, the recess or recesses 78 that are contiguous with the region 77 may be wider than the other recesses 78 to facilitate the formation of the desired edge-of-die structure (not shown) as discussed above. In one embodiment (not shown), the edge of die is immediately to the left of the region 77. In this embodiment, the body region 80 and the source region 82 at the left of the region 77 may be omitted.

The transistor 60 also includes body regions 80, which are disposed beneath respective portions of the gate structure 68 and are contiguous with the sidewalls of the respective recesses 78. Source regions 82 are disposed within the body regions 80 and are also contiguous with the sidewalls of the respective recesses 78. In one embodiment, the body regions 80 are doped P and the source regions 82 are doped N+.

Schottky contacts 84 are respectively disposed on the bottoms of the recesses 78, and a source/body metallization 86 is disposed on the Schottky contacts 84 and on the sidewalls of the recesses 78 such that the metallization 86 contacts the body and source regions 80 and 82. Thus, the junctions of the Schottky contacts 84 and the layer 66 together compose the built-in Schottky diode. (For clarity, a schematic symbol for the built-in Schottky diode is omitted from FIG. 3A.) By disposing both the Schottky contacts 84 and the source/body metallization 86 in the same recesses 78, the built-in Schottky diode occupies little or no additional layout area. In one embodiment, the Schottky contacts 84 are also disposed on the sidewalls of the recesses 78. Thus, the contacts 84 act as Schottky contacts where they directly contact the layer 66, and act as ohmic contacts between the bodies 80/sources 82 and the source/body metallization 86. Furthermore, in other embodiments, the source/body metallization 86 is formed from a metal such as aluminum and the Schottky contacts 84 are formed from titanium tungsten, platinum silicide, or another Schottky-diode-forming metal. In yet another embodiment, the body regions 80 extend into the layer 66 to a depth that is deeper than the bottoms of the respective recesses 78. Thus, these body regions 80 surround the respective bottoms of the recesses 78, and thus form respective guard rings around the Schottky junctions between the contacts 84 and layer 66. Such guard rings reduce the electric fields at the edges and corners of these junctions, and thus significantly increase the reverse breakdown voltage of the built-in Schottky diode.

Referring to FIG. 3B, the source/body metallization 86 is disposed over all of the recessed regions 78, which are shown in dashed line, and over the gate structure 68 except in the region 77 where the gate contact 76 is disposed. Except for the openings above the recessed regions 78, the gate 72 (FIG. 3A) is, in this embodiment, a continuous layer that is disposed below the source/body metallization 86 and is insulated therefrom by the side-wall insulators 74.

FIGS. 4–9 show steps of a process for manufacturing the transistor 60 of FIGS. 3A–3B according to an embodiment of the invention.

Figure 4:
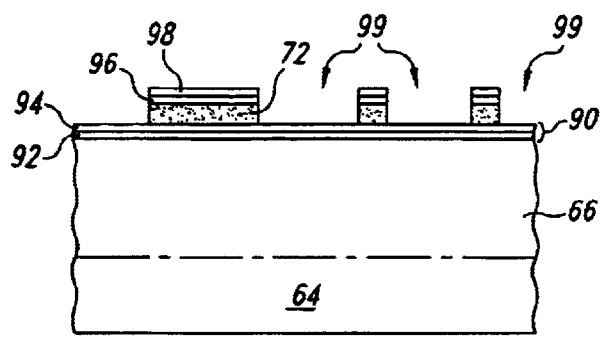
FIG. 4 is a cross section of a semiconductor structure at a point of a manufacturing process for the transistor of FIGS. 3A–3B according to an embodiment of the invention.

Referring to FIG. 4, after the conventional formation of the substrate 64 and the layer 66, an insulator structure 90, which will become the gate insulator 70 (FIG. 3A), is conventionally formed on the layer 66. In one embodiment, the structure 90 includes an oxide layer 92, which is grown or deposited on the layer 66. In another embodiment, a layer 94 of nitride is deposited on the oxide layer 92. When present, the nitride can be used as an etch stop in the subsequent processing steps. Next, polysilicon is conventionally formed on the structure 90 and doped. Then, an insulator layer 96 is conventionally formed on the polysilicon. In one embodiment, the polysilicon is oxidized to form the layer 96. Next, the gate 72 is conventionally formed from the polysilicon. In one embodiment, the layer 96 is masked with a layer 98 of photo resist, and openings 99 are etched into the layer 96 and the underlying polysilicon to form the gate electrode 72.

Figure 5:
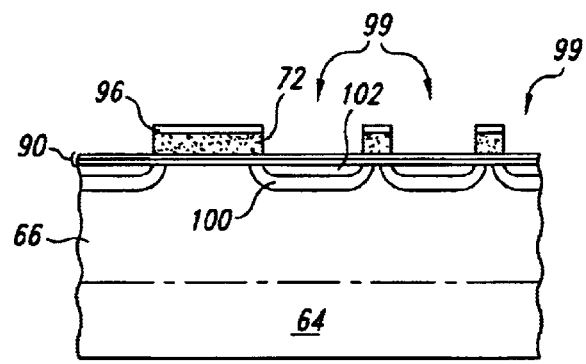
FIG. 5 is a cross section of the structure of FIG. 4 at a subsequent point in the process.

Referring to FIG. 5, doped regions 100 and 102 are conventionally formed in the layer 66 through the openings 99. Thus, in this embodiment, the regions 100 and 102 are self-aligned to the respective openings 99. In one embodiment, boron is implanted to form the region 100 having a retrograde profile. Next, the resist 98 (FIG. 4) is removed and arsenic is implanted to form the region 102 also having a retrograde profile.

Figure 6:
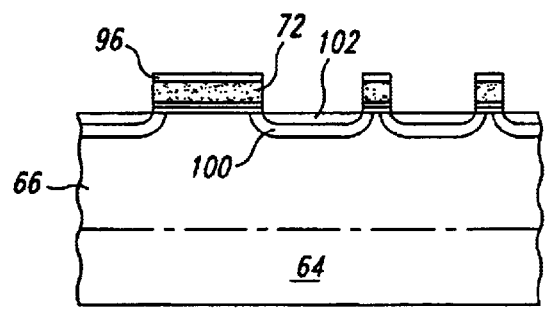
FIG. 6 is a cross section of the structure of FIG. 5 at a subsequent point in the process.

Referring to FIG. 6, the dopants in the regions 100 and 102 are conventionally driven deeper into the layer 66. In one embodiment, the semiconductor structure is heated to drive in the dopants in the regions 100 and 102. In embodiments that include the nitride layer 94, this heating may cause the oxide layer 96 to thicken. In embodiments that do not include the nitride layer 94, the heating may cause both the oxide layers 92 and 96 to thicken. Next, in embodiments that include the nitride layer 94, the nitride layer is conventionally removed. Then, the oxide layers 92 and 96 are conventionally removed.

Figure 7:
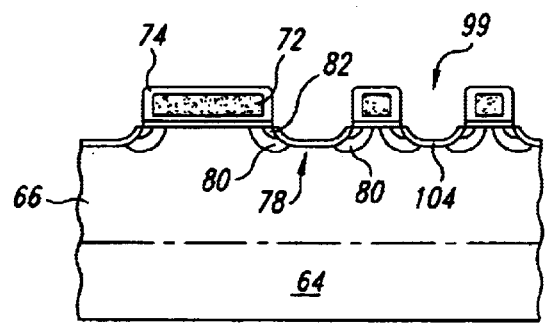
FIG. 7 is a cross section of the structure of FIG. 6 at a subsequent point in the process.

Referring to FIG. 7, the regions of the layer 66 exposed through the openings 99 are conventionally recessed to form the recesses 78. For example, the exposed regions of the layer 66 may be subjected to one or more of the following etch processes: wet, KOH, plasma, or anisotropic. Thus, in this embodiment, the recesses 78 are self-aligned to the openings 99. This self-alignment helps reduce the layout area of the transistor 60.

Next, in one embodiment, the dopants in the regions 100 and 102 (FIG. 6) are conventionally driven even deeper into the layer 66 so that the regions 100 are deeper than the bottoms of recesses 78. In such an embodiment, the semiconductor structure is heated to perform this drive-in, which forms the body regions 80 and source regions 82. This heating also forms a layer 104 of oxide on the exposed bottoms and sidewalls of the recesses 78 and forms the sidewalls 74 on the gate 72. In another embodiment, this additional drive-in step is omitted. In such an embodiment, the layer 104 and the sidewalls 74 are formed by heating or by another conventional technique.

Figure 1A:
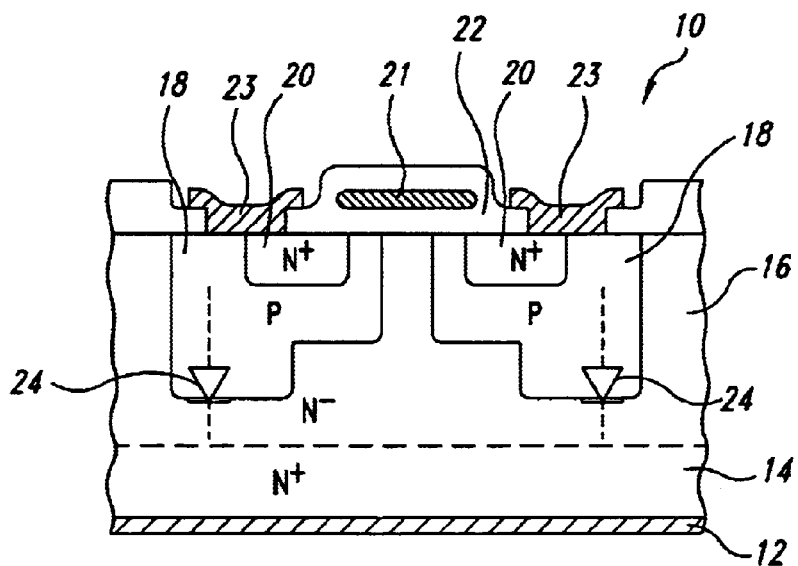
FIG. 1A is a cross section of a vertical DMOS transistor according to the prior art.
Figure 1B:
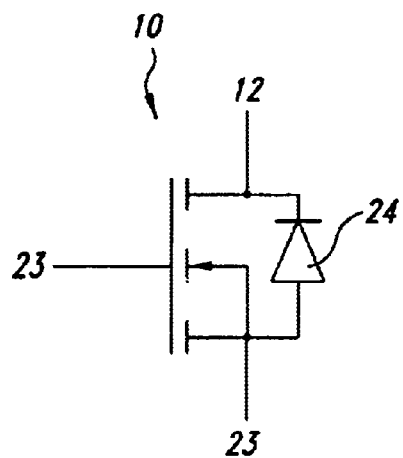
FIG. 1B is the schematic symbol for the transistor of FIGS. 1A–1B.
Figure 2A:
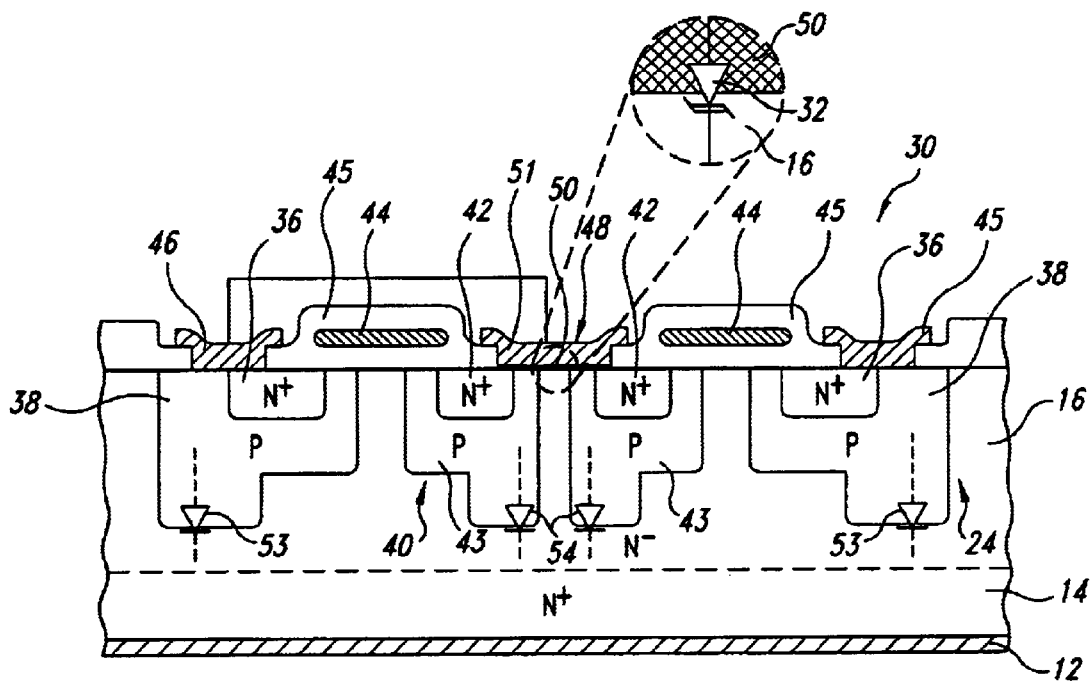
FIG. 2A is a cross section of a vertical DMOS transistor having a built-in Schottky diode according to the prior art.
Figure 2B:
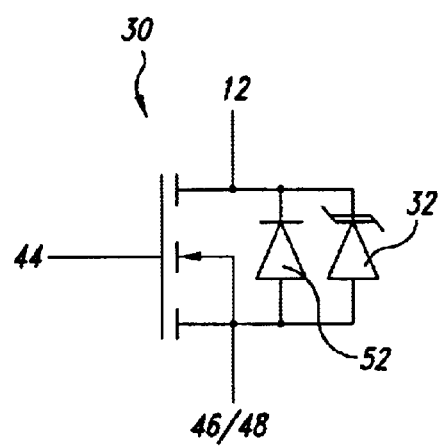
FIG. 2B is a schematic symbol for the transistor of FIGS. 2A–2B.
Figure 8:
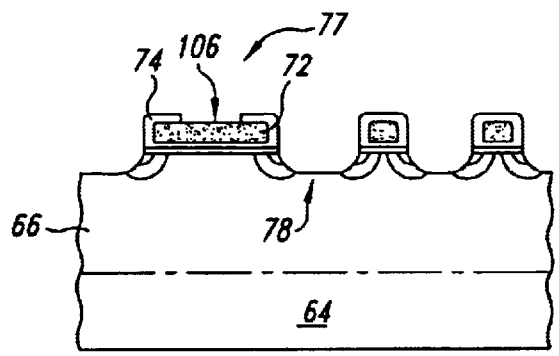
FIG. 8 is a cross section of the structure of FIG. 7 at a subsequent point in the process.

Referring to FIG. 8, a region 106 of the gate 72 is conventionally exposed to allow formation of the gate contact 76, and the oxide layer 104 (FIG. 7) is conventionally removed from the bottoms and sidewalls of the recesses 78. In one embodiment, a polysilicon contact masked is formed to expose a region of the sidewall 74 over the gate region 77, and this region of the sidewall 74 is etched to expose the region 106. Next, a conventional HF dip is performed to remove the oxide layer 104 from the bottoms and sidewalls of the recesses 78.

Figure 9:
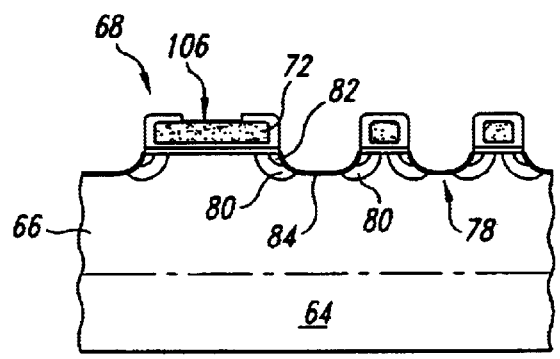
FIG. 9 is a cross section of the structure of FIG. 8 at a subsequent point in the process.

Referring to FIG. 9, the Schottky contacts 84 are conventionally formed. In one embodiment, platinum is deposited in the recesses 78 and on the gate structure 68 and is alloyed. Next, the platinum is removed by etching, leaving the platinum silicide that has formed where the platinum was in contact with silicon. Because platinum silicide makes good ohmic contacts, leaving the platinum silicide on the region 106 will not reduce the quality of the gate contact 76. Materials other than platinum, such as titanium tungsten, may be used as long as they are suitable to form a Schottky contact to the layer 66 and an ohmic contact to the body regions 80 and source regions 82.

Referring again to FIG. 3A, the gate contact 76 and the source metallization 86 are then conventionally formed. In one embodiment, a metal, such as aluminum, or multiple metals, such as titanium-tungsten and then aluminum, are deposited on the semiconductor structure. Then, the structure is masked and etched to delineate the gate contact 76 from the source metallization 86.

The described process embodiment can be performed with only three masks through the formation of the gate and source contacts 76 and 86, and thus is often much less complex than conventional processes used to form prior-art transistors. Furthermore, in embodiments where the above-described guard ring is formed around the Schottky junctions, the recesses 78 are formed after the regions 100 and 102 are formed but before these regions are driven in to their final depths. This sequence simplifies both the implantation and drive-in steps. Additionally, as discussed above, where the recesses 78 are formed after the gate structure 68, the recesses 78 are self aligned to the openings 99 in the gate structure, thus, further reducing the layout area of the transistor 60.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor device, comprising:
   a semiconductor substrate having a first conductivity;
   a first doped region in the substrate and having the first conductivity;
   a recess disposed in the first region and having a sidewall and a bottom;
   a gate insulator disposed on the substrate and extending to the sidewall of the recess;
   a gate electrode disposed on the gate insulator;
   a body region disposed in a second region beneath the gate electrode, the body region having a second conductivity and being contiguous with the sidewall, the body region being deeper than the recess, and being self-aligned to the bottom of the recess, self-aligned to the gate electrode at its outer perimeter, self-aligned to the sidewall of the recess at its inner perimeter, such that the body region is assured of being generally symmetrical on all sidewalls and to the bottom of the recess and present at the bottom corners of the recess;
   a source region disposed in the body region, having the first conductivity, and being contiguous with the sidewall;
   a Schottky contact disposed on the bottom of the recess; and
   a source metallization disposed on the Schottky contact and the sidewall of the recess.

2. The semiconductor device of claim 1 wherein the body region is deeper than the Schottky contact.

3. The semiconductor device of claim 1, further comprising:
   wherein the substrate has a second side that is opposite the first side; and
   a drain contact disposed on the second side of the substrate.

4. The semiconductor device of claim 1 wherein the first conductivity is N-type and the second conductivity is P-type.

5. The semiconductor device of claim 1 wherein the semiconductor layer comprises an epitaxial layer.

6. The semiconductor device of claim 1 wherein the substrate has a doping concentration that is greater than the doping concentration of the layer.

7. The semiconductor device of claim 1 wherein:
   the substrate and layer each comprise silicon; and
   the gate insulator comprises an oxide.

8. The semiconductor device of claim 1 wherein the gate electrode comprises polysilicon.

9. The semiconductor device of claim 1 wherein the source region is disposed beneath the gate electrode.

10. The semiconductor device of claim 1 wherein the Schottky contact comprises platinum silicide.

11. The semiconductor device of claim 1 wherein the source metallization comprises aluminum.

12. The semiconductor device of claim 1 wherein the Schottky contact is disposed between the recess sidewall and the source metallization.

13. The semiconductor device of claim 1 wherein the gate insulator comprises an edge that is aligned with the sidewall.

14. A semiconductor device, comprising:
    a semiconductor substrate having a first conductivity;
    a first doped region in the substrate and having the first conductivity;
    a gate insulator disposed on the substrate and having an edge;
    a gate electrode disposed on the gate insulator;
    a recess disposed in the first region and having a sidewall and a substantially flat bottom, the sidewall being aligned with the edge of the gate insulator;
    a body region disposed in a second region beneath the gate electrode, the body region having a second conductivity and being contiguous with the sidewall, the body region being deeper than the recess, and being self-aligned to the bottom of the recess, self-aligned to the gate electrode at its outer perimeter, self-aligned to the sidewall of the recess at its inner perimeter, such that the body region is assured of being generally symmetrical on all sidewalls and to the bottom of the recess and present at the bottom corners of the recess;
    a source region disposed in the body region, having the first conductivity, and being contiguous with the sidewall;
    a Schottky contact disposed on the bottom of the recess; and
    a source metallization disposed on the Schottky contact and the sidewall of the recess.

15. The semiconductor device of claim 14 wherein the body region is deeper than the Schottky contact.

16. The semiconductor device of claim 14 wherein the Schottky contact is disposed between the sidewall and the source metallization.

17. A semiconductor device, comprising:
    a semiconductor substrate having a first conductivity;
    a first doped region in the substrate and having the first conductivity;
    a recess disposed in the first region and having a sidewall and a bottom;
    a gate insulator disposed on the substrate and extending to the sidewall of the recess;
    a gate electrode disposed on the gate insulator;
    a body region disposed in a second region beneath the gate electrode, having a second conductivity, being contiguous with the sidewall, and being deeper than the recess, and being self-aligned to the bottom of the recess, self-aligned to the gate electrode at its outer perimeter, self-aligned to the sidewall of the recess at its inner perimeter, and present at the bottom corners of the recess;
    a source region disposed in the body region, having the first conductivity, and being contiguous with the sidewall being self-aligned to the gate at its outer perimeter and self-aligned to the sidewall of the recess at its inner perimeter;
    a Schottky contact disposed on the bottom of the recess; and
    a source metallization disposed on the Schottky contact and the sidewall of the recess.

18. The semiconductor device of claim 17 wherein the Schottky contact is disposed between the sidewall and the source metallization.

19. The semiconductor device of claim 17 wherein the gate insulator comprises an edge that is aligned with the sidewall.

20. A semiconductor device made by a method comprising:
- forming a gate structure on a semiconductor layer that is disposed on a semiconductor substrate, the gate structure exposing a portion of the layer to form an opening;
- implanting a first dopant of a first conductivity and a second dopant of a second conductivity through the opening into the exposed portion of the semiconductor layer, such that regions implanted with the first and second dopants are self-aligned to the opening;
- after implanting the first and second dopants, recessing the exposed portion of the semiconductor layer, wherein the recessed exposed portion is self-aligned to the opening;
- driving the first dopant deeper into the semiconductor layer after recessing the exposed portion;
- driving the first dopant deeper into the semiconductor layer than a bottom of the recessed exposed portion such that the first dopant is self-aligned to the exposed portion such that the first dopant is self-aligned to the sidewall of the recess at its inner perimeter and present at the bottom corners of the recess;
- after recessing the exposed portion, forming a Schottky contact on a bottom of the exposed portion; and
- forming a source metallization on the Schottky contact and a sidewall of the exposed portion.

21. The device of claim 20 wherein the forming a gate structure comprises:
- forming a first oxide layer on the semiconductor layer;
- forming a polysilicon layer on the first oxide layer;
- forming a second oxide layer on the polysilicon layer; and
- masking and etching the second oxide and polysilcon layers to form the gate structure.

22. The device of claim 20 wherein the forming a gate structure comprises:
- forming a first oxide layer on the semiconductor layer;
- forming a nitride layer on the first oxide layer;
- forming a polysilicon layer on the nitride layer;
- forming a second oxide layer on the polysilicon layer; and
- masking and etching the second oxide and polysilcon layers to form the gate structure.

23. The device of claim 20 wherein the first dopant comprises boron and the second dopant comprises arsenic.

24. The device of claim 20 wherein the forming the Schottky contact comprises forming a layer of platinum silicide on the bottom of the exposed portion.

25. The device of claim 20 wherein the forming the Schottky contact comprises forming the Schottky contact on the sidewall of the exposed portion.

26. The device of claim 20 wherein the forming the source metallization comprises forming a layer of aluminum on the Schottky contact and the sidewall of the exposed portion.

27. The device of claim 20 wherein the forming the source metallization comprises forming a layer of titanium tungsten on the Schottky contact and the sidewall of the exposed portion.

28. A semiconductor device, comprising:
- a semiconductor substrate having a first conductivity;
- a first doped region in the substrate and having the first conductivity;
- a recess disposed in the first region and having a sidewall and a bottom;
- a gate insulator disposed on the substrate and extending to the sidewall;
- a gate electrode disposed on the gate insulator;
- a body region disposed in a second region beneath the gate electrode, the body region having a second conductivity and being contiguous with the sidewall, the body region being deeper than the recess, and being self-aligned to the bottom of the recess, self-aligned to the gate electrode at its outer perimeter, self-aligned to the sidewall of the recess at its inner perimeter, and present at the bottom corners of the recess;
- a source region disposed in the body region, having the first conductivity, and being contiguous with the sidewall being self-aligned to the gate at its outer perimeter and self-aligned to the sidewall of the recess at its inner perimeter;
- a Schottky contact disposed on the bottom of the recess; and
- a source metallization disposed on the Schottky contact and the sidewall of the recess.

29. A semiconductor device, comprising:
- a semiconductor substrate having a first conductivity,
- a first doped region in the substrate and having the first conductivity;
- a gate insulator disposed on the substrate and having an edge;
- a gate electrode disposed on the gate insulator;
- a recess disposed in the first region and having a sidewall and a bottom, the sidewall being aligned with the edge of the gate insulator;
- a body region disposed in a second region beneath the gate electrode, the body region having a second conductivity and being contiguous with the sidewall, the body region being deeper than the recess, and being self-aligned to the gate electrode at its outer perimeter, self-aligned to the sidewall of the recess at its inner perimeter, and present at the bottom corners of the recess;
- a source region disposed in the body region, having the first conductivity, and being contiguous with the sidewall self-aligned to the gate at its outer perimeter and self-aligned to the sidewall the recess at its inner perimeter;
- a Schottky contact disposed on the bottom of the recess; and
- a source metallization disposed on the Schottky contact and the sidewall of the recess.

* * * * *